United States Patent
Okada

(10) Patent No.: US 8,164,735 B2
(45) Date of Patent: Apr. 24, 2012

(54) REGULATING DEVICE, EXPOSURE APPARATUS AND DEVICE MANUFACTURING METHOD

(75) Inventor: Yoshiyuki Okada, Sakura (JP)

(73) Assignee: Canon Kabushiki Kaisha, Tokyo (JP)

( * ) Notice: Subject to any disclaimer, the term of this patent is extended or adjusted under 35 U.S.C. 154(b) by 683 days.

(21) Appl. No.: 12/397,014

(22) Filed: Mar. 3, 2009

(65) Prior Publication Data
US 2009/0218088 A1 Sep. 3, 2009

(30) Foreign Application Priority Data
Mar. 3, 2008 (JP) .................................. 2008-052668

(51) Int. Cl.
G03B 27/32 (2006.01)
G03B 27/52 (2006.01)
G05D 23/00 (2006.01)

(52) U.S. Cl. .............................. 355/30; 165/299; 355/77

(58) Field of Classification Search .................... 62/183, 62/185–186; 165/201, 244, 247, 253, 287–288, 165/293, 299–300; 355/30, 77
See application file for complete search history.

(56) References Cited

U.S. PATENT DOCUMENTS

| 6,700,641 | B2 | 3/2004 | Shiraishi |
| 7,565,926 | B2 | 7/2009 | Okada |
| 2006/0005554 | A1 | 1/2006 | Okada |
| 2009/0090498 | A1* | 4/2009 | Okada ........................ 165/299 |

FOREIGN PATENT DOCUMENTS

| JP | 11-135429 | 5/1999 |
| JP | 2006-012564 | 1/2006 |
| JP | 2006-031113 A | 2/2006 |
| KR | 10-0769238 A | 10/2007 |

* cited by examiner

*Primary Examiner* — Hung Henry Nguyen
*Assistant Examiner* — Colin Kreutzer
(74) *Attorney, Agent, or Firm* — Canon USA Inc IP Division

(57) ABSTRACT

The present invention is a regulating device configured to regulate a temperature T2 of a first medium in accordance with a target temperature. The regulating device comprises a heat exchanger 16, a control valve 14, temperature sensors 2 and 4, temperature sensors 6 and 8, and a heat quantity control unit 30 and a temperature control unit 50 configured to calculate a target exchange heat quantity in the heat exchanger 16, calculate an exchange heat quantity in the heat exchanger 16, add a signal dependent upon a difference between the target exchange heat quantity and the exchange heat quantity to a signal dependent upon a difference between an output of the temperature sensor 4 and the target temperature, and control the control valve 14 so that a difference between the output of the temperature sensor 4 and the target temperature is reduced.

6 Claims, 5 Drawing Sheets

REGULATING DEVICE, EXPOSURE APPARATUS AND DEVICE MANUFACTURING METHOD

BACKGROUND OF THE INVENTION

1. Field of the Invention

The present invention relates to a regulating device which regulates a temperature of a medium.

2. Description of the Related Art

Recently, a semiconductor integrated circuit such as an IC and an LSI requires a high productivity and a fabrication of an ultrafine circuit pattern. Therefore, a rapid and accurate positioning control is necessary. The positioning accuracy heavily depends on the length measurement accuracy by a laser interferometer. In order to achieve the accuracy of nanometer order, the temperature fluctuation of the interferometer optical path needs to be sufficiently suppressed. Therefore, it is necessary to suppress the influence of the temperature change in a clean room where an exposure apparatus is placed or the like, and a medium (fluid) such as air or liquid whose temperature is always stable with respect to the load change of the exposure apparatus needs to be supplied to the exposure apparatus.

In particular, a positioning apparatus which rapidly operates, that is to say, a stage which mounts a reticle or a wafer generates a large heat load for a rapid operation during the exposure process. On the other hand, it does not substantially generate the heat load during the change of the wafer or the reticle and the alignment because of the low velocity operation. Since these operations are alternately performed, the exposure apparatus repeats an abrupt load change.

Japanese Patent Laid-Open No. 11-135429 discloses a fluid supplying apparatus which supplies fluid to an exposure apparatus. The fluid supplying apparatus disclosed in Japanese Patent Laid-Open No. 11-135429 is configured to detect the temperature of air which is supplied to the exposure apparatus and control the temperature by operating a Peltier device or a heater. Then, the air supplied to the exposure apparatus is returned to the fluid supplying apparatus by a feedback duct. Thus, the heat load is recovered via a fan or a cooling machine and the temperature control is performed by the Peltier device or the heater described above.

Japanese Patent Laid-Open No. 2006-12564 discloses a cooling apparatus which suppresses the influence of the load change. The cooling apparatus disclosed in Japanese Patent Laid-Open No. 2006-12564 is configured to have a fuel cell as a load, recover a generated heat by flowing cooling water to the fuel cell, and recover the heat of the cooling water by a heat exchange of the cooling water and the heated water by a heat exchanger. At that time, it regulates the flow rate of the heated water by changing the driving performance of a pump based on the temperature difference of the heated water between an entrance and an exit of the heat exchanger and the flow rate of the heated water, and operates so that the temperature of the cooling water outputted from the heat exchanger is a predetermined value. The flow rate of the heated water is detected by a flow sensor which is attached at the output side of the pump.

In the conventional technology, the cooling heat quantity required to change the temperature at the exit of the heat exchanger to a predetermined value is calculated based on the temperature of the cooling water which flows into the heat exchanger with the heat load. The flow rate of the heated water is regulated by changing the driving performance of the pump so that the actual cooling heat quantity calculated based on the temperature difference of the heated water at the entrance and the exit of the heat exchanger and the flow rate of the heated water is equal to the calculated cooling heat quantity. Thus, the influence of the load change is suppressed.

Japanese Patent Laid-Open No. 11-135429 discloses a temperature control method which controls the temperature in a chamber of an exposure apparatus. However, the temperature control method disclosed in Japanese Patent Laid-Open No. 11-135429 performs a feedback control of the temperature of air which is supplied to the exposure apparatus. Therefore, if the load of the exposure apparatus is abruptly changed, a large temperature error is generated because of a response delay. Thus, a temperature control with high accuracy for an abrupt and large load change in the exposure apparatus cannot be performed.

Japanese Patent Laid-Open No. 2006-12564 discloses a control apparatus which regulates the flow rate of cooling water. The control apparatus in Japanese Patent Laid-Open No. 2006-12564 performs a control so that the cooling heat quantity required to set the temperature at the exit of the heat exchanger calculated based on the temperature of the cooling water which flows into the heat exchanger to a predetermined value is equal to the cooling heat quantity calculated based on the temperature difference of the heated water at the entrance and the exit of the heat exchanger and the flow rate of the heated water.

However, actually, there is a case where the temperature at the exit of the heat exchanger does not be the predetermined value. This is because there is a measurement error of the flow sensor or the temperature sensor or an error of the heat exchange efficiency in the heat exchanger, or the like. Therefore, in the conventional technology, a temperature control with high accuracy for an abrupt and large load change in an exposure apparatus cannot be performed.

There are a Karman vortex method, an ultrasound waver method, an impeller method, an electromagnetic method, and the like, as a detecting method of a flow sensor. Most of the flow sensors of the Karman vortex method or the impeller method are small and inexpensive. However, a detecting range of the flow sensors is limited and the detecting accuracy in a low flow rate is also a problem. For example, the flow sensor whose accuracy is equal to ±3% F.S and detecting range is 8 L/min to 50 L/min cannot detect the flow rate equal to or lower than 8 L/min. Because the accuracy is ±1.5 L/min, the detecting accuracy at the minimum flow rate is 8±1.5 L/min. Therefore, the error ratio with respect to the flow rate of 8 L/min is ±12.5%, which is extremely large.

In the conventional technology, the flow rate of the heated water is significantly changed by regulating the driving performance of the pump because of the change of the heat load. In other words, the flow rate of the heated water is reduced when the heat load is small. On the other hand, the flow rate of the heated water is regulated so as to be increased when the heat load is large. The flow rate of the heated water is detected by a flow sensor. However, as described above, because of the detecting limitation and the detecting error of the flow sensor, in particular, a flow rate detecting error is large in the case where the flow rate is low, and in some cases, the flow rate cannot be detected. Therefore, the operation of the temperature control is unstable. Thus, the conventional technology cannot perform a temperature control with high accuracy with respect to an abrupt and large load change in an exposure apparatus.

SUMMARY OF THE INVENTION

The present invention, for example, provides a regulating device which is capable of stably regulating a temperature of a medium.

A regulating device as one aspect of the present invention is configured to regulate a temperature of a first medium in accordance with a target temperature. The regulating device comprises a heat exchanger configured to perform a heat exchange between the first medium and a second medium, a control valve configured to control a flow rate of the second medium which flows into the heat exchanger, a first temperature sensor configured to detect a temperature of the second medium flowed out of the heat exchanger, a second temperature sensor configured to detect a temperature of the first medium flowed out of the heat exchanger, a third temperature sensor configured to detect a temperature of the second medium flowing into the heat exchanger, a fourth temperature sensor configured to detect a temperature of the first medium flowing into the heat exchanger, and a controller configured to calculate a target exchange heat quantity in the heat exchanger based on an output of the fourth temperature sensor and the target temperature, calculate an exchange heat quantity in the heat exchanger based on outputs of the third temperature sensor and the first temperature sensor and the flow rate of the second medium, add a signal dependent upon a difference between the target exchange heat quantity and the exchange heat quantity to a signal dependent upon a difference between an output of the second temperature sensor and the target temperature, and control the control valve so that a difference between the output of the second temperature sensor and the target temperature is reduced based on a signal obtained by the addition.

A regulating device as another aspect of the present invention is configured to regulate a temperature of a first medium in accordance with a target temperature. The regulating device comprises a heat exchanger configured to perform a heat exchange between the first medium and a second medium, a control valve configured to control a flow rate of the second medium which flows into the heat exchanger, a first temperature sensor configured to detect a temperature of the second medium flowed out of the heat exchanger, a second temperature sensor configured to detect a temperature of the first medium flowed out of the heat exchanger, a third temperature sensor configured to detect a temperature of the second medium flowing into the heat exchanger, and a controller configured to calculate a target exchange heat quantity in the heat exchanger based on information of a heat load with respect to the first medium, calculate an exchange heat quantity in the heat exchanger based on outputs of the third temperature sensor and the first temperature sensor and a flow rate of the second medium, add a signal dependent upon a difference between the target exchange heat quantity and the exchange heat quantity to a signal dependent upon a difference between an output of the second temperature sensor and the target temperature, and control the control valve so that the difference between the output of the second temperature sensor and the target temperature is reduced based on a signal obtained by the addition.

Further features and aspects of the present invention will become apparent from the following description of exemplary embodiments with reference to the attached drawings.

DESCRIPTION OF THE EMBODIMENTS

Exemplary embodiments of the present invention will be described below with reference to the accompanied drawings.

Figure 5:
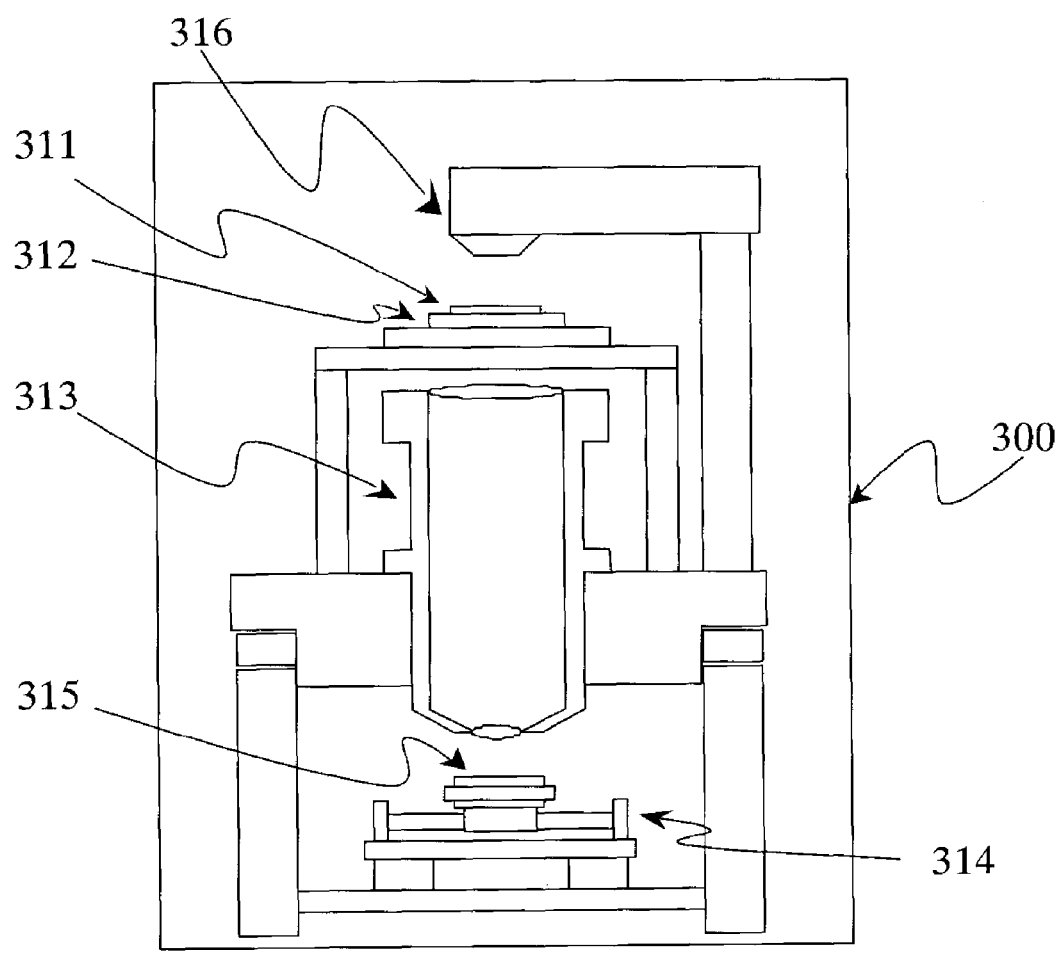
FIG. 5 is a configuration diagram showing an overview of an exposure apparatus in the embodiment of the present invention.

FIG. 5 is a configuration diagram of a typical exposure apparatus. An exposure apparatus 300 emits exposure light from an exposure light source (not shown) and irradiates a reticle 311 which is placed on a reticle stage 312 by using an illumination optical system 316. Thus, the illumination optical system 316 irradiates the reticle 311 with the light from the light source.

The light transmitted through the reticle 311 transmits a projection optical system 313 and reaches a wafer 315 which is placed on a wafer stage 314 in order to expose a fine pattern depicted on the reticle onto each chip on the wafer. Thus, the projection optical system 313 projects the light from the reticle 311 onto the wafer.

As an exposure light source, a KrF laser light source, or an ArF laser light source which has a short wavelength for further miniaturized processes is often used.

In an exposure apparatus which is called a "stepper", the reticle stage 312 stops and the wafer stage 314 stops during exposure and it is operated by a stepping drive for exposing the next chip when the exposure is completed. On the other hand, in an exposure apparatus which is called a "scanning stepper", the reticle stage 312 and the wafer stage 314 are synchronously oppositely scanned to each other. The exposure is performed during the synchronous scanning and the wafer stage 314 is operated by a stepping drive for exposing the next chip when the exposure is completed. In the scanning stepper, in order to further improve the productivity, each of the reticle stage 312 and the wafer stage 314 needs to be driven with extremely-high velocity and its position or velocity needs to be extremely precisely controlled for fine exposure.

Generally, a synchronous scanning or a step driving of a stage which is floated by air, a magnetic force, or the like, is often performed by a linear motor using a principle of a Lorentz force or by an actuator such as a planar motor. In this case, because a frictional force in a horizontal direction is extremely low, a generated thrust of the actuator which is required for the synchronous scanning or the step driving is proportional to acceleration and mass of the stage.

For example, the generated thrust of the linear motor is proportional to a drive current, and the generated heat of the linear motor is proportional to the square of a motor winding resist value and the drive current. Therefore, the generated heat of the linear motor increases in proportion to the square of the generated thrust force, that is to say, the acceleration of the stage. It means that the generated heat of the linear motor is quadrupled when the acceleration is doubled.

With respect to the actuator of the stage which generates such a large amount of heat, a regulating device that recovers the heat by flowing liquid such as pure water or brine as a cooling medium and that regulates a temperature of the medium is connected.

Each of the reticle stage 312 and the wafer stage 314 generates extremely large amount of heat during exposure. On the other hand, when the exposure apparatus exchanges the wafer 315 or the reticle 311 or performs a measurement or an alignment, it stops the operation. Therefore, the generated heat is substantially equal to zero and an abrupt and significant load change is generated.

Furthermore, in the exposure apparatus, there are many precise measurement systems other than the stages. In order to perform ultrafine exposure, the cooling medium which is supplied from the regulating device to the exposure apparatus needs to be always maintained at a stable temperature without depending on the load change. In other words, the regulating device connected to the exposure apparatus needs to perform a fluid temperature control which is always stable with respect to an abrupt and significant load change.

On the other hand, in order to control the position of each of the reticle stage 312 and the wafer stage 314 with high accuracy of nanometer order, generally, each position of these stages is always monitored by a laser interferometer and a feedback control is performed. However, when a large amount of heat is generated by driving each of the stages, an optical path of the laser interferometer is disturbed by the heat quantity. As a result, the refractive index of the air in the optical path is fluctuated and a large amount of error is generated in measuring the position of the stage. In order to control the stage with nanometer order accuracy, the temperature fluctuation of the optical path of the interferometer needs to be equal to or less than 0.01° C. The air whose temperature is precisely controlled by the regulating device is supplied in a space where these measurement systems are positioned. Similarly to the cooling medium of the liquid described above, the temperature of the supplied air needs to be always stably controlled with respect to the abrupt and significant load change.

Figure 1:
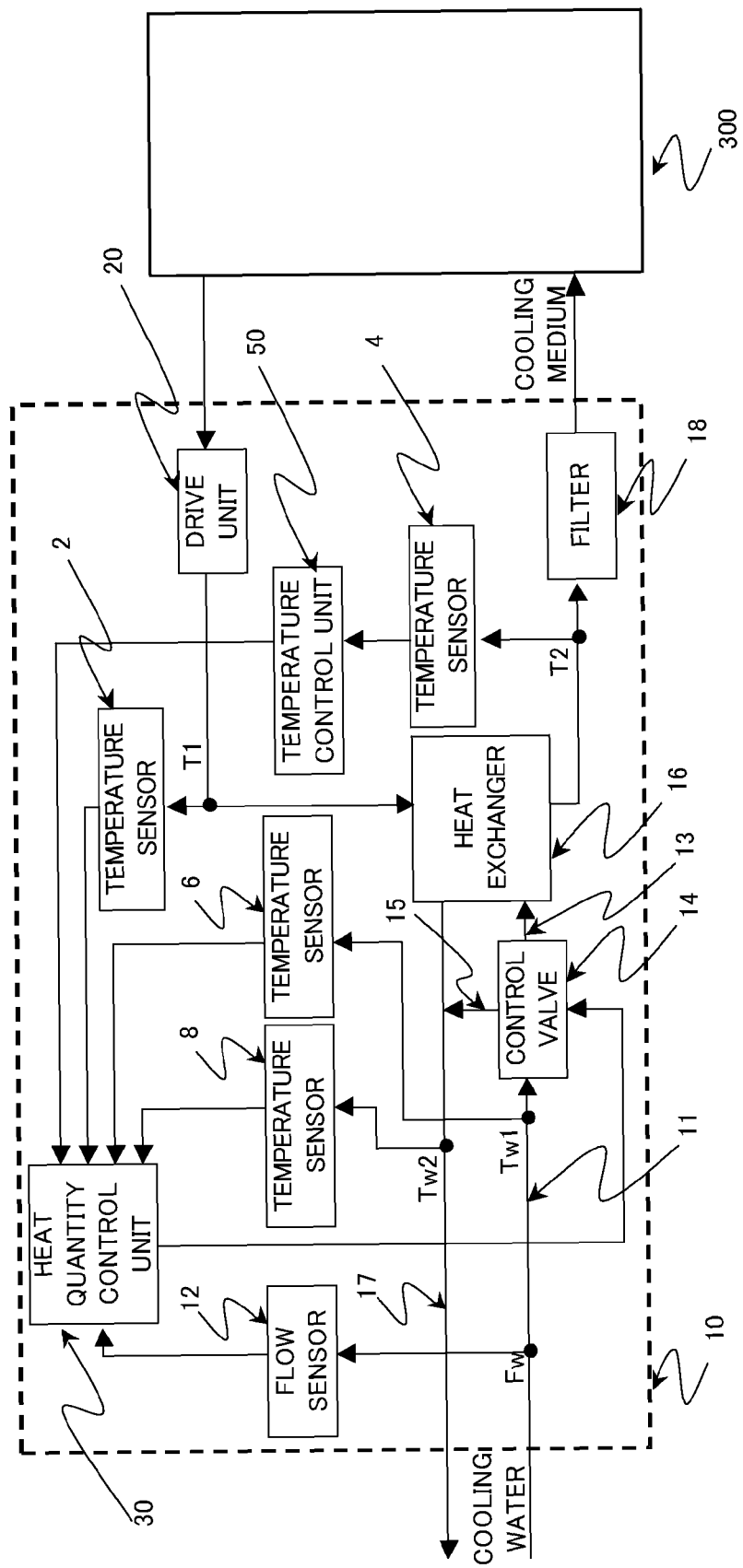
FIG. 1 is a configuration diagram of a regulating device in embodiment 1 of the present invention.

FIG. 1 is a configuration diagram of a regulating device in embodiment 1 of the present invention.

A regulating device 10 is connected to an exposure apparatus 300. The regulating device 10 can be provided inside the exposure apparatus 300 or outside the exposure apparatus 300. The regulating device 10 can be integrated with the exposure apparatus 300 or separated from the exposure apparatus 300.

A cooling medium (a first medium) which is supplied in order to cool the exposure apparatus 300 (a heat load) can be any one of air and liquid such as pure water or brine. If it is possible to appropriately cool the exposure apparatus 300, other cooling media (fluid) can also be used. A drive unit 20 is a means for driving the first medium. As the drive unit 20, for example, a fan and a pump are used for the air and the liquid, respectively.

The first medium returned from the exposure apparatus 300 flows into a heat exchanger 16 with the heat load inside the exposure apparatus. At the input side of the heat exchanger 16, a temperature sensor 2 (a fourth temperature sensor) is positioned. The temperature sensor 2 detects a temperature T1 of the first medium which flows into the heat exchanger 16. In other words, the temperature sensor 2 detects the temperature change by the heat load inside the exposure apparatus. As a flow rate of the first medium, a predetermined value or an initially-regulated value is used if a driving performance of the drive unit 20 is constant. On the other hand, if the driving performance of the drive unit 20 is variable, the flow rate of the first medium can be detected by positioning a flow sensor (not shown) at the input side or the output side of the heat exchanger 16.

In order to change a temperature of the first medium at the output side of the heat exchanger 16 to a target temperature Tref, the recovery of heat quantity represented by the following expression (1) is necessary.

Target heat quantity=(Temperature $T1$ detected by temperature sensor 2−Target temperature $Tref$)× Flow rate of cooling medium×Heat quantity required to increase temperature of 1° C. per unit flow rate  (1)

At the output side of the heat exchanger 16, a temperature sensor 4 (a second temperature sensor) is positioned. The temperature sensor 4 detects a temperature T2 of the first medium flowed out of the heat exchanger 16. The temperature T2 of the first medium detected by the temperature sensor 4 is inputted to a temperature control unit 50. As described later, in the temperature control unit 50, the temperature T2 of the first medium is fed back with respect to the target temperature Tref, and the difference between the target temperature Tref and the temperature T2 of the first medium is calculated. The control unit 50 performs a control so that the difference is reduced. The first medium is supplied to the exposure apparatus 300 via a filter 18 if needed.

On the other hand, cooling water (a second medium) which is supplied from equipment in a semiconductor factory flows into the heat exchanger 16 in order to recover the heat load of the first medium. The temperature of the cooling water is around 10 to 20° C. The cooling water is connected to a control valve 14 via a pipe 11. A pipe 13 is a main flow path which is connected to the input side of the heat exchanger 16. A pipe 15 is a bypass flow path which is connected to the output side of the heat exchanger 16, and is returned by a pipe 17 to the equipment of the factory. In the present embodiment, cooling water is used as a second medium. However, other cooling media (fluid) such as air can also be used.

The control valve 14 may be constituted by a three-way valve which is capable of performing a proportional control or may also be constituted by two two-way valves which perform a push-pull operation. The flow rate of the cooling water (the second medium) which flows into the heat exchanger 16 is regulated by changing the opening degree of the control valve 14 based on a control signal outputted from a heat quantity control unit 30. In this case, if the flow rate into the main flow path (the pipe 13) is changed, the flow rate into the bypass flow path (the pipe 15) is changed to the reversed polarity. Therefore, a sum of the flow rate of the main flow path (the pipe 13) and the bypass flow path (the pipe 15), that is to say, the flow rate flowing into the pipe 17 is always substantially constant. Thus, the control valve 14 controls the ratio of division of the cooling water flowed from the pipe 11 into the main flow path (the pipe 13) which passes through the heat exchanger 16 and the bypass flow path (the pipe 15) which bypasses the heat exchanger 16.

The flow rate of the cooling water (the second medium) may be obtained by using a predetermined value or an initially regulated value, or may also be obtained by connecting a flow sensor 12 (a flow rate detecting means) to the pipe 11 or the pipe 17 in order to measure the flow rate Fw of the cooling water. Generally, the flow sensor has a limitation of the detecting range. In particular, an error increases when the flow rate is low, and it cannot be detected by the flow rate when it is out of the detecting range. Therefore, in the present embodiment, the bypass flow path (the pipe 15) is provided so that the flowrate of the cooling water which flows into the pipes 11 and 17 is substantially constant. As a result, the flow rate can be always measured stably without the limitation of the detecting range of the flow sensor 12.

The temperature of the cooling water is detected by a temperature sensor 6 (a third temperature sensor) and a temperature sensor 8 (a first temperature sensor). The temperature sensor 6 is positioned at the vicinity of the pipe 11 or the pipe 13. The temperature sensor 6 (the third temperature sensor) detects the temperature Tw1 of the cooling water (the second medium) which flows into the heat exchanger 16. The temperature sensor 8 is positioned at the vicinity of the pipe 17 which is at the downstream side of the joint of the main flow path (the pipe 13) and the bypass flow path (the pipe 15). The first temperature sensor detects a temperature Tw2 of the cooling water (the second medium) which flows out of the heat exchanger 16.

The cooling heat quantity that the cooling water has recovered through the heat exchanger 16 is represented by the following expression (2).

Cooling heat quantity=(Temperature $Tw2$ detected by temperature sensor 8−Temperature $Tw1$ detected by temperature sensor 6)×Flow rate $Fw$ of cooling water×Heat quantity required to increase 1° C. per unit flow rate (2)

Figure 2:
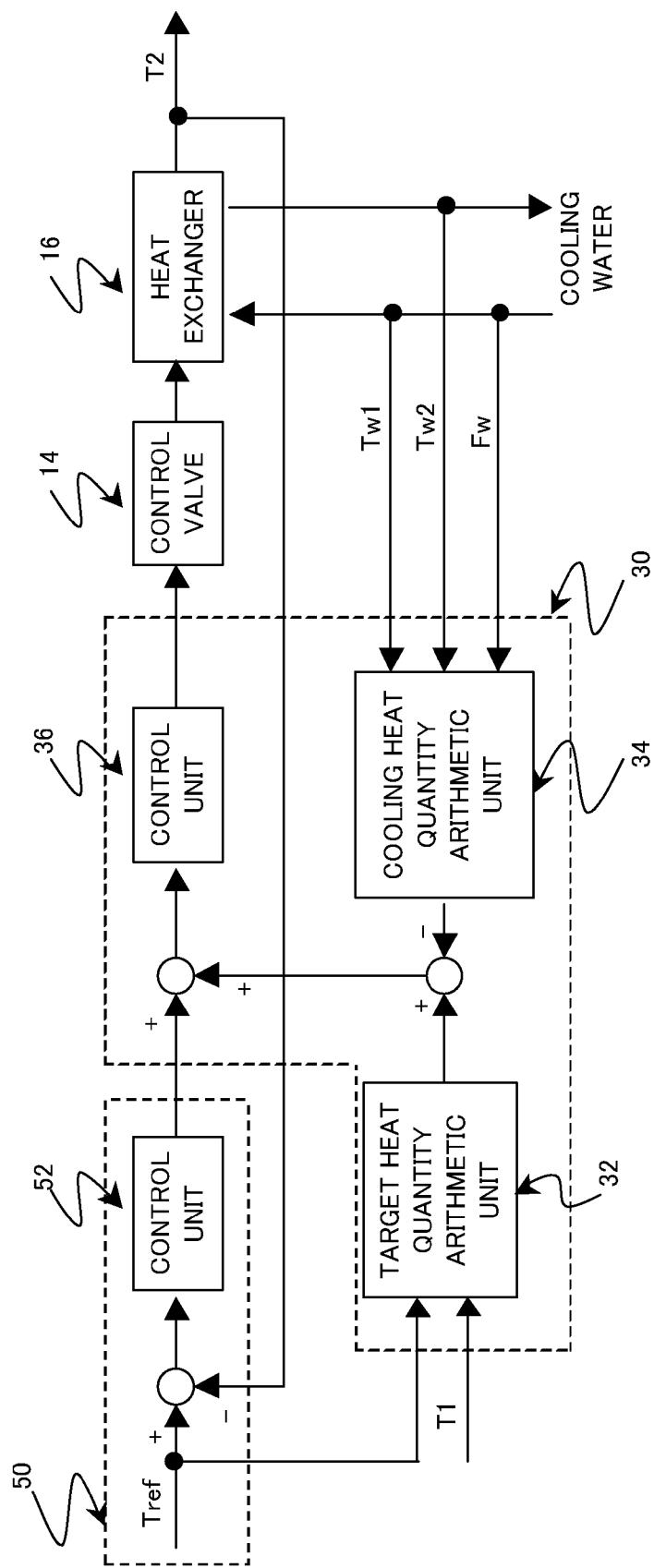
FIG. 2 is a control block diagram of a regulating device in embodiment 1 of the present invention.

Next, referring to FIG. 2, various kinds of control arithmetic units which are provided in the regulating unit 10 will be described.

The cooling target heat quantity required to change the temperature T1 of the first medium with the heat load to a predetermined value can be obtained by calculating the expression (1) at a target heat quantity arithmetic unit 32 of a heat quantity control unit 30. The target heat quantity arithmetic unit 32 inputs the temperature T1 of the first medium detected by the temperature sensor 2 and compares the temperature T1 with the target temperature Tref in order to output the target heat quantity.

The cooling heat quantity that the cooling water has recovered can be obtained by calculating the expression (2) at a cooling heat quantity arithmetic unit 34. The cooling heat quantity arithmetic unit 34 inputs the temperature Tw1 of the second medium detected by the temperature sensor 6, the temperature Tw2 of the second medium detected by the temperature sensor 8, and the flow rate Fw of the second medium detected by the flow sensor 12, in order to output the cooling heat quantity.

If there is a gain error or an offset error of the temperature sensor, the flow sensor, or the like, in calculating the target heat quantity or the cooling heat quantity, the correction of the gain and the offset may be performed by the target heat quantity arithmetic unit 32 and the cooling heat quantity arithmetic unit 34.

Next, in the heat quantity control unit 30, a deviation of the target heat quantity and the cooling heat quantity is calculated. This deviation is added to the output of a control unit 52 in order to input the control unit 36. The control unit 36 performs a proportional control calculation, a proportional-integral calculation, or a proportional-integral-derivative calculation, and performs a control so that the following expression (3) is satisfied.

Target heat quantity=Cooling heat quantity (3)

A control signal outputted from the control unit 36 is inputted to the control valve 14. The control valve controls the flow rate of the cooling water which flows into the heat exchanger 16 and regulates the cooling heat quantity.

Thus, the target heat quantity arithmetic unit 32 detects the heat load and calculates the cooling target heat quantity which is required to change the temperature T2 of the first medium to a predetermined value. The cooling heat quantity arithmetic unit 34 calculates the cooling heat quantity by the cooling water (the second medium). Thus, because the control is performed so that both of the target heat quantity and the cooling heat quantity are equal to each other, the cooling heat quantity with respect to the abrupt load change is rapidly controlled and the response is improved compared to a common feedback control.

However, actually, there is an error of the target heat quantity and the cooling heat quantity in the heat quantity control unit 30, that is to say, a measurement error of the flow sensor or the temperature sensor, an error of the heat exchange efficiency in the heat exchanger, and the like. Therefore, even if the control is performed so as to satisfy the expression (3) as described above, the temperature T2 of the first medium at the output side of the heat exchanger 16 cannot be the predetermined value. Furthermore, the temperature varies by the change of the heat load and the temperature control with high accuracy is difficult.

In the present embodiment, the temperature T2 of the first medium at the output side of the heat exchanger 16 is detected by the temperature sensor 4 and is inputted to the temperature control unit 50. At the temperature control unit 50, the deviation between the target temperature Tref and the temperature T2 of the first medium is calculated and is inputted to the control unit 52. The control unit 52 performs a proportional control calculation, a proportional-integral calculation, or a proportional-integral-derivative calculation, and performs a control so that the following expression (4) is satisfied.

Target temperature Tref=Temperature T2 detected by temperature sensor 4 (4)

The control signal outputted from the control unit 52 is inputted to the heat quantity control unit 30. At the heat quantity control unit 30, the deviation between the target heat quantity calculated by the target heat quantity arithmetic unit 32 and the cooling heat quantity calculated by the cooling heat quantity arithmetic unit 34 is added to the control signal, and the signal obtained by the addition is inputted to the control unit 36. In the embodiment, a signal dependent upon the difference between a target exchange heat quantity and an exchange heat quantity is added to a signal dependent upon the difference between the output of the temperature sensor 4 and the target temperature Tref, and the signal obtained from the addition is inputted to the control unit 36.

The control unit 36 generates an operation amount which satisfies the expression (4) based on an operation amount which satisfies the expression (3) and controls the opening degree of the control valve 14.

The control valve 14 controls the cooling heat quantity by regulating the flow rate of the cooling water which flows into the main flow path based on the control signal outputted from the control unit 36. Thus, the control valve 14 operates so that the temperature of the first medium at the output side of the heat exchanger 16 is a predetermined value, that is to say, so that the expression (4) is satisfied.

Therefore, even if there is a measurement error of the flow sensor or the temperature sensor, an error of the heat exchange efficiency in the heat exchanger, and the like, the temperature control unit 50 can perform a control so that the temperature of the first medium at the output side of the heat exchanger 16 is always the predetermined value.

As described above, the heat quantity control unit 30 and the temperature control unit 50 in the present embodiment are used as a controller which performs a control so that the temperature T2 of the first medium coincides with the target temperature Tref. The controller calculates the target exchange heat quantity in the heat exchanger 16 based on the output of the temperature sensor 2 and the target temperature Tref, and calculates the exchange heat quantity in the heat exchanger 16 based on the outputs of the temperature sensors 6 and 8 and the flow rate Fw of the second medium. Furthermore, the controller adds a signal dependent upon the difference between the target exchange heat quantity and the exchange heat quantity to a signal dependent upon the difference between the output of the temperature sensor 4 and the target temperature Tref, and controls the control valve 14 so that the difference between the output of the temperature sensor 4 and the target temperature Tref is reduced based on the signal obtained by the addition.

As described above, according to the present embodiment, a regulating device that recovers the heat of an exposure apparatus and regulates a temperature of fluid supplied in order to stably maintain a temperature of the exposure apparatus and that always performs a stable fluid temperature control for the load change of the exposure apparatus can be provided.

Next, embodiment 2 of the present invention will be described.

Figure 3:
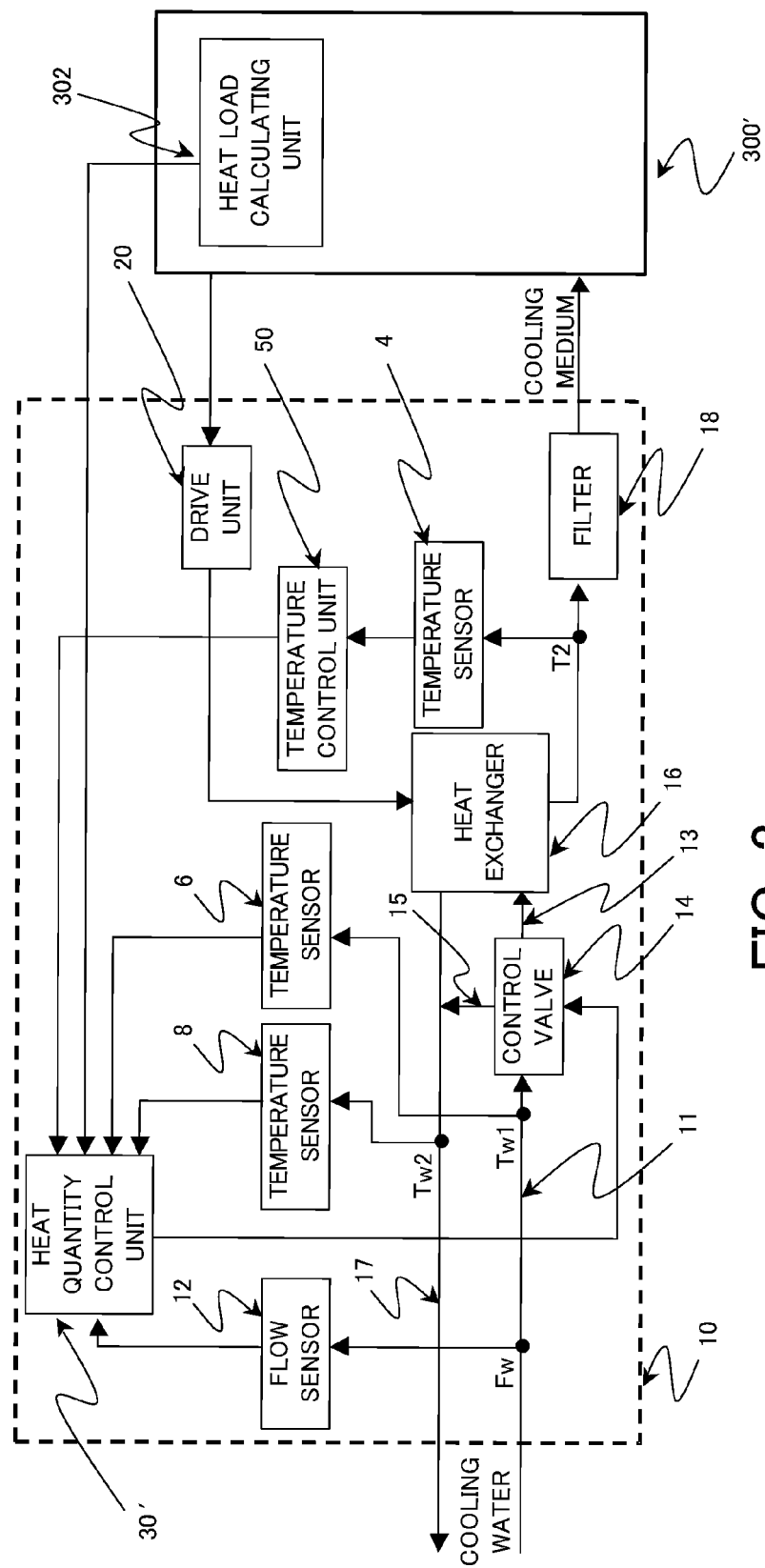
FIG. 3 is a configuration diagram of a regulating device in embodiment 2 of the present invention.

FIG. 3 is a configuration diagram of a regulating device in embodiment 2 of the present invention. In FIG. 3, components which have the same function as those of embodiment 1 are denoted by the same reference numerals, and a description thereof is omitted.

An exposure apparatus 300' includes a heat load calculating unit 302. The heat load calculating unit 302 calculates a heat load of the exposure apparatus based on apparatus operation information such as a scanning velocity or an acceleration of the wafer stage or the reticle stage and the number of exposure shots for the set exposure process. The heat load calculated in the heat load calculating unit 302 is outputted to a heat quantity control unit 30' of the regulating device 10.

Figure 4:
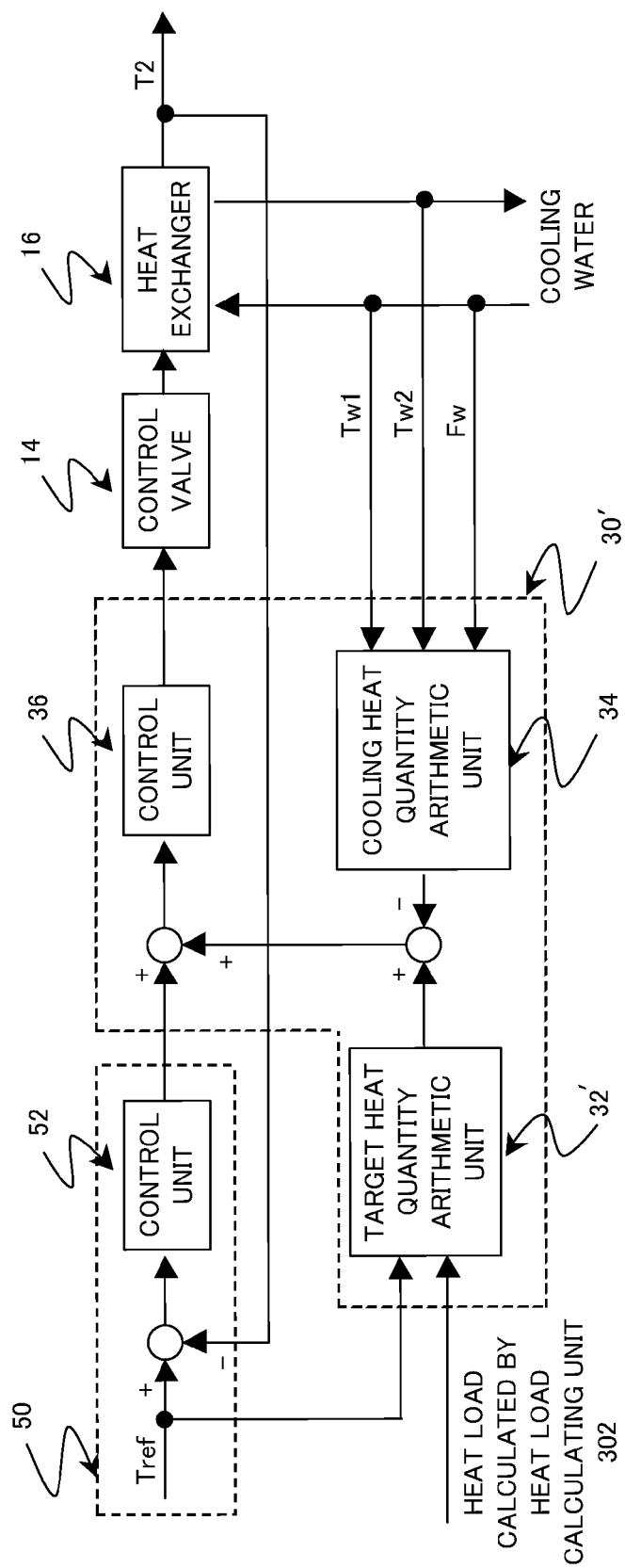
FIG. 4 is a control block diagram of a regulating device in embodiment 2 of the present invention.

FIG. 4 is a control block diagram of a regulating device in embodiment 2 of the present invention.

A signal outputted from the heat load calculating unit 302 is inputted to a target heat quantity arithmetic unit 32'. In the target heat quantity arithmetic unit 32', the target heat quantity is calculated by the following expression (5).

$$\text{Target heat quantity} = \text{Heat load of exposure apparatus} + \text{Heat input to cooling medium} \quad (5)$$

In the embodiment, the heat input to the cooling medium means a heat input by the drive unit 20, a heat input from a pipe, a duct, or the like, or a friction heat by a pressure drop. The heat input to the cooling medium can be obtained by using an actual measurement value or a design value.

The operations of the cooling heat quantity arithmetic unit 34 and the temperature control unit 50 are the same as those of embodiment 1.

Thus, the heat load calculating unit 302 and the target heat quantity arithmetic unit 32' calculate a cooling heat quantity required to change the temperature of the cooling medium to a predetermined value based on the heat load of the exposure apparatus and the heat input to the cooling medium. Furthermore, the cooling heat quantity arithmetic unit 34 calculates the cooling heat quantity by the cooling water and performs a control so that both of the target heat quantity and the cooling heat quantity are equal to each other.

Thus, the cooling heat quantity with respect to the abrupt load change of the exposure apparatus is rapidly controlled, and the response is improved compared to a common feedback control.

Even if there is an error of the target heat quantity and the cooling heat quantity in the heat quantity control unit 30', that is to say, a calculation error of the heat load of the apparatus or an error of the heat input to the cooling medium, the temperature at the output side of the heat exchanger 16 of the cooling medium is controlled by the temperature control unit 50 so as to be always a predetermined value.

As described above, the heat quantity control unit 30' and the temperature control unit 50 are used as a controller which performs a control so that the temperature T2 of the first medium coincides with the target temperature Tref. The controller calculates the target exchange heat quantity in the heat exchanger 16 based on the information on the heat load for the first medium and the target temperature Tref, and calculates the exchange heat quantity in the heat exchanger 16 based on the outputs of the temperature sensors 6 and 8 and the flow rate Fw of the second medium. Furthermore, the controller adds a signal dependent upon the difference between the target exchange heat quantity and the exchange heat quantity to a signal dependent upon the difference between the output of the temperature sensor 4 and the target temperature Tref, and controls the control valve 14 so that the difference between the output of the temperature sensor 4 and the target temperature Tref is reduced based on the signal obtained by the addition.

As described above, according to the present embodiment, a regulating device that recovers the heat of an exposure apparatus and regulates a temperature of fluid supplied in order to stably maintain a temperature of the exposure apparatus and that always performs a stable temperature control of a cooling medium for the load change of the exposure apparatus can be provided.

Furthermore, in the present embodiment, the temperature sensor 2 which detects the temperature of the first medium which flows into the heat exchanger 16 is not necessary. Therefore, a regulating device which is inexpensive compared to the regulating device of embodiment 1 can be provided.

Next, one example of a device manufacturing method using an exposure apparatus which includes the regulating device 10 in the above embodiment will be described. A device (a semiconductor integrated circuit device, a liquid crystal display device, or the like) is manufactured by a process of exposing a substrate (a wafer, a glass plate, or the like) coated by a photosensitizing agent using the exposure apparatus of one of the above embodiments, a process of developing the substrate exposed in the above process, and other well-known processes.

According to the above device manufacturing method, devices with high quality can be manufactured. Thus, the device manufacturing method using the exposure apparatus in the above embodiment and the device as a result object also constitute one aspect of the present invention.

As described above, according to the above embodiment of the present invention, a regulating device that recovers the heat of an exposure apparatus and regulates a temperature of fluid supplied in order to stably maintain a temperature of the exposure apparatus, and that always performs a stable fluid temperature control for the load change of the exposure apparatus can be provided.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

For example, the above embodiments assumed that the regulating device of the present invention is used for cooling the exposure apparatus or apart of it. It is because the exposure apparatus requires an accurate temperature regulation.

However, the regulating device of the present invention is not limited to this, but can also be used for cooling an apparatus other than an exposure apparatus or a part of it.

This application claims the benefit of Japanese Patent Application No. 2008-052668, filed on Mar. 3, 2008, which is hereby incorporated by reference herein in its entirety.

What is claimed is:

1. A regulating device configured to regulate a temperature of a first medium in accordance with a target temperature, the regulating device comprising:
    a heat exchanger configured to perform a heat exchange between the first medium and a second medium;
    a control valve configured to control a flow rate of the second medium which flows into the heat exchanger;
    a first temperature sensor configured to detect a temperature of the second medium flowed out of the heat exchanger;
    a second temperature sensor configured to detect a temperature of the first medium flowed out of the heat exchanger;
    a third temperature sensor configured to detect a temperature of the second medium flowing into the heat exchanger;
    a fourth temperature sensor configured to detect a temperature of the first medium flowing into the heat exchanger; and
    a controller configured to calculate a target exchange heat quantity in the heat exchanger based on an output of the fourth temperature sensor and the target temperature, calculate an exchange heat quantity in the heat exchanger based on outputs of the third temperature sensor and the first temperature sensor and the flow rate of the second medium, add a signal dependent upon a difference between the target exchange heat quantity and the exchange heat quantity to a signal dependent upon a difference between an output of the second temperature sensor and the target temperature, and control the control valve so that a difference between the output of the second temperature sensor and the target temperature is reduced based on a signal obtained by the addition.

2. A regulating device according to claim 1, further comprising:
    a main flow path configured to flow the second medium into the heat exchanger and flow the second medium out of the heat exchanger; and
    a bypass flow path of the second medium configured to bypass the heat exchanger,
    wherein the first temperature sensor detects a temperature of the second medium at a downstream side of a junction at which the main flow path and the bypass flow path join.

3. A regulating device according to claim 1, further comprising a flow sensor configured to detect a flow rate of the second medium.

4. A regulating device configured to regulate a temperature of a first medium in accordance with a target temperature, the regulating device comprising:
    a heat exchanger configured to perform a heat exchange between the first medium and a second medium;
    a control valve configured to control a flow rate of the second medium which flows into the heat exchanger;
    a first temperature sensor configured to detect a temperature of the second medium flowed out of the heat exchanger;
    a second temperature sensor configured to detect a temperature of the first medium flowed out of the heat exchanger;
    a third temperature sensor configured to detect a temperature of the second medium flowing into the heat exchanger; and
    a controller configured to calculate a target exchange heat quantity in the heat exchanger based on information of a heat load with respect to the first medium, calculate an exchange heat quantity in the heat exchanger based on outputs of the third temperature sensor and the first temperature sensor and a flow rate of the second medium, add a signal dependent upon a difference between the target exchange heat quantity and the exchange heat quantity to a signal dependent upon a difference between an output of the second temperature sensor and the target temperature, and control the control valve so that the difference between the output of the second temperature sensor and the target temperature is reduced based on a signal obtained by the addition.

5. An exposure apparatus configured to expose a substrate, comprising:
    a flow path of a first medium; and
    a regulating device configured to regulate a temperature of the first medium in accordance with a target temperature, the regulating device comprising:
    a heat exchanger configured to perform a heat exchange between the first medium and a second medium;
    a control valve configured to control a flow rate of the second medium which flows into the heat exchanger;
    a first temperature sensor configured to detect a temperature of the second medium flowed out of the heat exchanger;
    a second temperature sensor configured to detect a temperature of the first medium flowed out of the heat exchanger;
    a third temperature sensor configured to detect a temperature of the second medium flowing into the heat exchanger;
    a fourth temperature sensor configured to detect a temperature of the first medium flowing into the heat exchanger; and
    a controller configured to calculate a target exchange heat quantity in the heat exchanger based on an output of the fourth temperature sensor and the target temperature, calculate an exchange heat quantity in the heat exchanger based on outputs of the third temperature sensor and the first temperature sensor and the flow rate of the second medium, add a signal dependent upon a difference between the target exchange heat quantity and the exchange heat quantity to a signal dependent upon a difference between an output of the second temperature sensor and the target temperature, and control the control valve so that a difference between the output of the second temperature sensor and the target temperature is reduced based on a signal obtained by the addition.

6. A device manufacturing method comprising the steps of:
    exposing a substrate using an exposure apparatus; and
    developing the substrate exposed in the exposing step,
    wherein the exposure apparatus comprises a flow path of a first medium and a regulating device configured to regulate a temperature of the first medium in accordance with a target temperature, the regulating device comprising:
    a heat exchanger configured to perform a heat exchange between the first medium and a second medium;

a control valve configured to control a flow rate of the second medium which flows into the heat exchanger;

a first temperature sensor configured to detect a temperature of the second medium flowed out of the heat exchanger;

a second temperature sensor configured to detect a temperature of the first medium flowed out of the heat exchanger;

a third temperature sensor configured to detect a temperature of the second medium flowing into the heat exchanger;

a fourth temperature sensor configured to detect a temperature of the first medium flowing into the heat exchanger; and a controller configured to calculate a target exchange heat quantity in the heat exchanger based on an output of the fourth temperature sensor and the target temperature, calculate an exchange heat quantity in the heat exchanger based on outputs of the third temperature sensor and the first temperature sensor and the flow rate of the second medium, add a signal dependent upon a difference between the target exchange heat quantity and the exchange heat quantity to a signal dependent upon a difference between an output of the second temperature sensor and the target temperature, and control the control valve so that a difference between the output of the second temperature sensor and the target temperature is reduced based on a signal obtained by the addition.

* * * * *